(12) United States Patent
Shirotori et al.

(10) Patent No.: US 12,648,468 B2
(45) Date of Patent: Jun. 2, 2026

(54) WIRING SUBSTRATE

(71) Applicant: SHINKO ELECTRIC INDUSTRIES CO., LTD., Nagano (JP)

(72) Inventors: Toshiki Shirotori, Nagano (JP); Ryota Hoshina, Nagano (JP); Kenta Nakamura, Nagano (JP)

(73) Assignee: SHINKO ELECTRIC INDUSTRIES, CO., LTD., Nagano (JP)

( * ) Notice: Subject to any disclaimer, the term of this patent is extended or adjusted under 35 U.S.C. 154(b) by 204 days.

(21) Appl. No.: 18/403,954

(22) Filed: Jan. 4, 2024

(65) Prior Publication Data

US 2024/0234289 A1      Jul. 11, 2024

(30) Foreign Application Priority Data

Jan. 10, 2023      (JP) ................................. 2023-001713

(51) Int. Cl.
| | |
|---|---|
| *H10W 70/65* | (2026.01) |
| *H05K 1/02* | (2006.01) |
| *H05K 1/11* | (2006.01) |
| *H10W 70/685* | (2026.01) |

(52) U.S. Cl.
CPC .......... *H10W 70/65* (2026.01); *H05K 1/0298* (2013.01); *H05K 1/115* (2013.01); *H10W 70/685* (2026.01); *H05K 2201/09563* (2013.01); *H05K 2201/09827* (2013.01)

(58) Field of Classification Search
CPC ......... H01L 23/49838; H01L 23/49822; H01L 23/49827; H05K 1/0298; H05K 1/115; H05K 2201/09563; H05K 2201/09827; H05K 1/113; H05K 2201/096; H05K 2201/09845
See application file for complete search history.

(56) References Cited

U.S. PATENT DOCUMENTS

| | | | | |
|---|---|---|---|---|
| 6,703,310 B2 * | 3/2004 | Mashino | ............. | H01L 25/0657 |
| | | | | 438/668 |
| 9,814,135 B2 * | 11/2017 | Nakamura | ............. | H05K 1/111 |
| 2018/0184521 A1 * | 6/2018 | Kitajo | .................. | H05K 3/4602 |
| 2019/0230791 A1 | 7/2019 | Kitajo et al. | | |
| 2020/0373233 A1 * | 11/2020 | Nishimura | ............. | H05K 1/112 |
| 2022/0130746 A1 * | 4/2022 | Muroga | .................. | H01L 24/16 |

FOREIGN PATENT DOCUMENTS

| | | |
|---|---|---|
| JP | 2018107349 A | 7/2018 |
| JP | 2021168348 A | 10/2021 |

* cited by examiner

*Primary Examiner* — Aditya Sharma

(74) *Attorney, Agent, or Firm* — Tarolli, Sundheim, Covell & Tummino LLP

(57)      ABSTRACT

A wiring substrate includes a first insulation layer, a first wiring layer including a pad formed on an upper surface of the first insulation layer, a second insulation layer formed on the upper surface of the first insulation layer to cover the first wiring layer, a first hole extending through the second insulation layer in a thickness-wise direction and partially exposing an upper surface of the pad, a second hole formed in the second insulation layer to be continuous with the first hole and widening a bottom opening of the first hole and entirely exposing a side surface of the pad in a thickness-wise direction, a via wiring filling the first hole and the second hole, and a second wiring layer formed on an upper surface of the second insulation layer integrally with the via wiring. The second hole partially exposes the upper surface of the first insulation layer.

8 Claims, 15 Drawing Sheets

WIRING SUBSTRATE

CROSS-REFERENCE TO RELATED APPLICATIONS

This application is based upon and claims the benefit of priority from prior Japanese Patent Application No. 2023-001713, filed on Jan. 10, 2023, the entire contents of which are incorporated herein by reference.

FIELD

This disclosure relates to a wiring substrate and a method for manufacturing a wiring substrate.

BACKGROUND

Wiring substrates on which electronic components such as semiconductor elements are mounted have various shapes and various structures. Japanese Laid-Open Patent Publication No. 2021-168348 describes a wiring substrate obtained by alternately stacking wiring layers and insulation layers through a build-up process. The wiring layers are electrically connected to each other by via wirings that are formed in through holes extending through the insulation layers in a thickness-wise direction.

When a reliability test or the like is conducted and heat is applied to the wiring substrate, a crack may be formed in the interface between the via wiring and the wiring layer. Formation of a crack in the interface between the via wiring and the wiring layer decreases the electrical connection reliability of the via wiring and the wiring layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An embodiment of a wiring substrate includes a first insulation layer, a first wiring layer including a pad formed on an upper surface of the first insulation layer, a second insulation layer formed on the upper surface of the first insulation layer to cover the first wiring layer, a first hole extending through the second insulation layer in a thickness-wise direction of the second insulation layer and exposing a portion of an upper surface of the pad, a second hole formed in the second insulation layer to be continuous with the first hole, the second hole increasing a width of a bottom opening of the first hole and entirely exposing a side surface of the pad in a thickness-wise direction of the pad, a via wiring filling the first hole and the second hole, and a second wiring layer formed on an upper surface of the second insulation layer integrally with the via wiring. The second hole exposes a portion of the upper surface of the first insulation layer.

Other features and aspects will be apparent from the following description, the drawings, and the claims.

BRIEF DESCRIPTION OF DRAWINGS

The embodiments, together with objects and advantages thereof, may best be understood by reference to the following description of the presently preferred embodiments together with the accompanying drawings in which.

DETAILED DESCRIPTION

Figure 1:
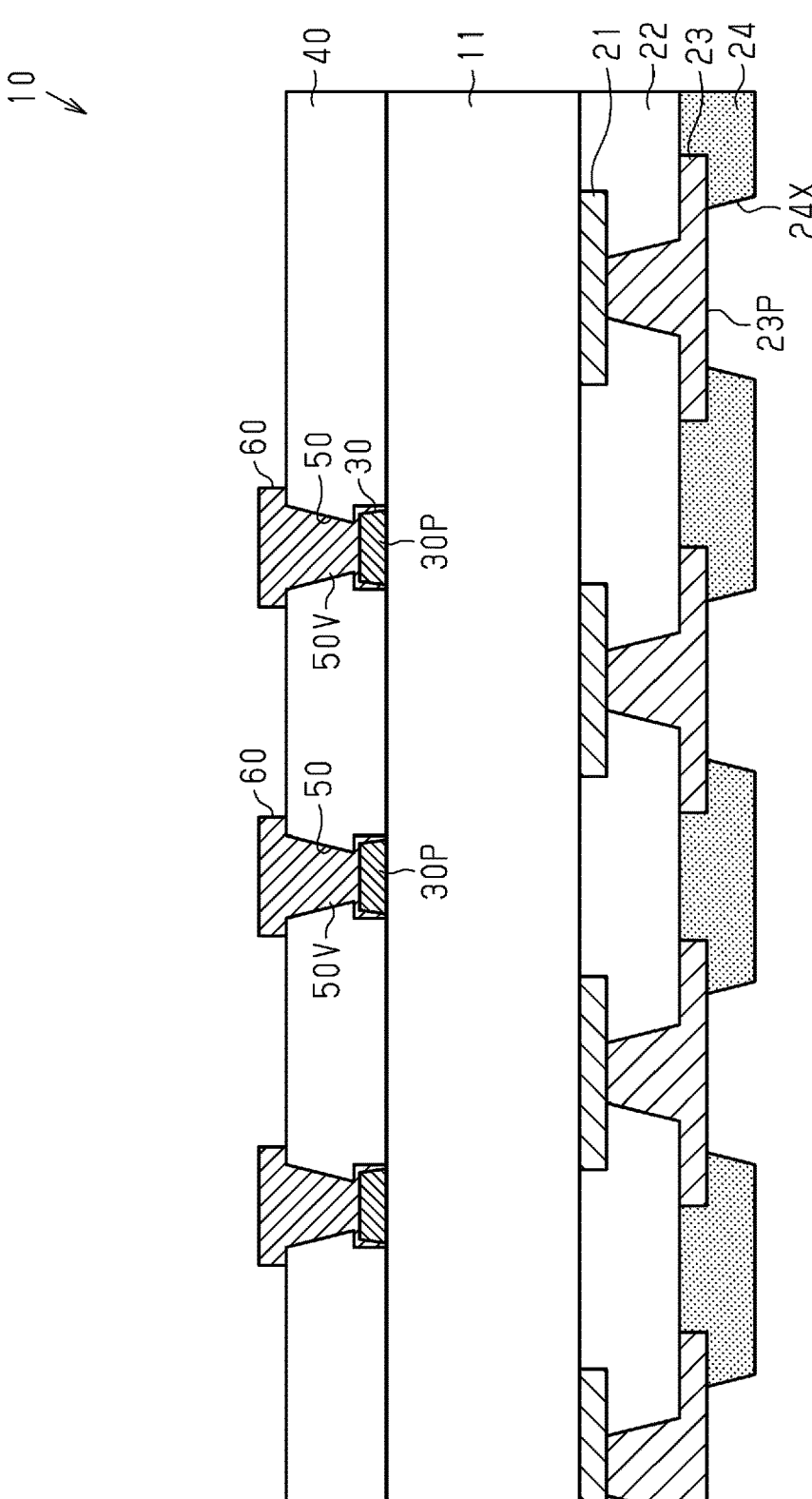
FIG. 1 is a schematic cross-sectional view illustrating an embodiment of a wiring substrate.

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

An embodiment will now be described with reference to the accompanying drawings.

Elements in the drawings may be partially enlarged for simplicity and clarity and thus have not necessarily been drawn to scale. To facilitate understanding, hatching lines may not be illustrated or may be replaced by shadings in the cross-sectional drawings. In this specification, "plan view" refers to a view of a subject taken in a vertical direction (for example, upper-lower direction in FIG. 1), and "planar shape" refers to a shape of a subject viewed in the vertical direction. In this specification, the frame of reference for "the vertical direction" and "the sideward direction" is each drawing positioned so that the reference characters are properly read. In addition, "parallel," "orthogonal," and "perpendicular" in this specification are not limited to exactly parallel, exactly orthogonal, and exactly perpendicular and include generally parallel, generally orthogonal, and generally perpendicular within the scope in which the operation and advantages of the embodiment are obtained. In this specification, "equal" includes exact equal and a case in which compared subjects slightly differ from each other due to dimensional tolerances or the like.

General Structure of Wiring Substrate 10

The structure of a wiring substrate 10 will now be described with reference to FIG. 1.

As illustrated in FIG. 1, the wiring substrate 10 includes, for example, a substrate body 11. A wiring layer 21, an insulation layer 22, a wiring layer 23, and a solder resist layer 24 are sequentially stacked on the lower surface of the substrate body 11. A wiring layer 30, an insulation layer 40, and a wiring layer 60 are sequentially stacked on the upper surface of the substrate body 11.

The substrate body 11 may be, for example, a wiring structural body in which insulative resin layers and wiring layers are alternately stacked. In an example, the wiring structural body may but does not necessarily have to, include a core substrate. The material of the insulative resin layer may be, for example, a thermosetting insulative resin. The thermosetting insulative resin may be, for example, an epoxy resin, a polyimide resin, or a cyanate resin. Alternatively, the material of the insulative resin layer may be, for example, an insulative resin including a photosensitive resin such as a phenol resin or a polyimide resin as a main component. The insulative resin layer may include, for example, a filler such as silica or alumina.

The material of the wiring layers in the substrate body 11 and the wiring layers 21, 23, and 30 may be, for example, copper (Cu) or a copper alloy. The material of the insulation layers 22 and 40 may be, for example, a thermosetting insulative resin. The thermosetting insulative resin may be, for example, an epoxy resin, a polyimide resin, or a cyanate resin.

The wiring layer 21 is formed on the lower surface of the substrate body 11. The insulation layer 22 is formed on the lower surface of the substrate body 11 to cover the wiring layer 21. The wiring layer 23 is formed on the lower surface of the insulation layer 22. In an example, the wiring layer 23 is formed integrally with a via wiring extending through the insulation layer 22 in the thickness-wise direction and is electrically connected to the wiring layer 21 by the via wiring.

The solder resist layer 24 is formed on the lower surface of the insulation layer 22 to cover the wiring layer 23. The material of the solder resist layer 24 may be, for example, an insulative resin including a photosensitive resin such as a phenol resin or a polyimide resin as a main component. The solder resist layer 24 may include, for example, a filler such as silica or alumina. The material of the solder resist layer 24 is not limited to an insulative resin including a photosensitive resin as a main component and may be, for example, the same insulative resin as used in the insulation layer 22. The solder resist layer 24 includes openings 24X that partially expose the lower surface of the wiring layer 23 as external connection pads 23P. When the wiring substrate 10 is mounted on a mount substrate such as a motherboard, external connection terminals such as solder balls or lead pins are connected to the external connection pads 23P.

A surface-processed layer may be formed on the lower surface of the wiring layer 23 exposed in the bottom of the openings 24X. In an example, the surface-processed layer includes a gold (Au) layer, a nickel (Ni) layer/Au layer (metal layer formed by stacking the Ni layer and the Au layer in this order), and a Ni layer/palladium (Pd) layer/Au layer (metal layer formed by stacking the Ni layer, the Pd layer, and the Au layer in this order). The Au layer is a metal layer formed from Au or an Au alloy. The Ni layer is a metal layer formed from Ni or a Ni alloy. The Pd layer is a metal layer formed from Pd or a Pd alloy. Each of the Ni layer, the Au layer, and the Pd layer may be, for example, a metal layer formed through an electroless plating process, that is, an electroless plating metal layer. In another example of the surface-processed layer, an organic solderability preservative (OSP) film may be formed on the surface of the external connection pads 23P through an anti-oxidation process such as an OSP process. The OSP film may be a coating of an organic compound such as an azole compound or an imidazole compound. When a surface-processed layer is formed on the lower surface of the wiring layer 23, the surface-processed layer is used as the external connection pads 23P. The wiring layer 23 exposed in the bottom of the opening 24X (or surface-processed layer when formed on the wiring layer 23) may be used as the external connection terminal.

The wiring layer 30 is formed on the upper surface of the substrate body 11. The wiring layer 30 is, for example, electrically connected to the wiring layer 21 via a wiring layer or a through electrode formed in the substrate body 11. The thickness of the wiring layer 30 may be, for example, approximately 5 μm to 20 μm.

The insulation layer 40 is formed on the upper surface of the substrate body 11 to cover the wiring layer 30. The thickness from the upper surface of the wiring layer 30 to the upper surface of the insulation layer 40 may be, for example, approximately 10 μm to 30 μm.

The insulation layer 40 includes a through hole 50 extending through the insulation layer 40 in the thickness-wise direction and exposing the upper surface of the wiring layer 30. The through hole 50 further exposes the side surface of the wiring layer 30 and a portion of the upper surface of the substrate body 11 located around the wiring layer 30. In other words, the through hole 50 extends from the upper surface of the insulation layer 40 to the lower surface of the insulation layer 40. The through hole 50 may have any planar shape and any size. In an example, the through hole 50 is circular in plan view. The depth of the through hole 50 may be, for example, approximately 15 μm to 50 μm.

The wiring layer 60 is formed on the upper surface of the insulation layer 40. The wiring layer 60 is the outermost wiring layer (in this embodiment, uppermost wiring layer) of the wiring substrate 10. The wiring layer 60 is used as, for example, a connection pad for connection with an electronic component such as a semiconductor element. A surface-processed layer may be formed on the surface (side surface and upper surface or only upper surface) of the wiring layer 60. In an example, the surface-processed layer may be an OSP film or a metal layer such as an Au layer, an Ni layer/Au layer, or an Ni layer/Pd layer/Au layer. The thickness of the wiring layer 60 may be, for example, approximately 5 μm to 20 μm.

In an example, the wiring layer 60 is electrically connected to the wiring layer 30 via a via wiring 50V that is formed in the through hole 50 of the insulation layer 40. In an example, the wiring layer 60 is formed continuously and integrally with the via wiring 50V. In an example, the via wiring 50V fills the through hole 50. The thickness of the via wiring 50V may be, for example, approximately 15 μm to 50 μm.

Figure 2:
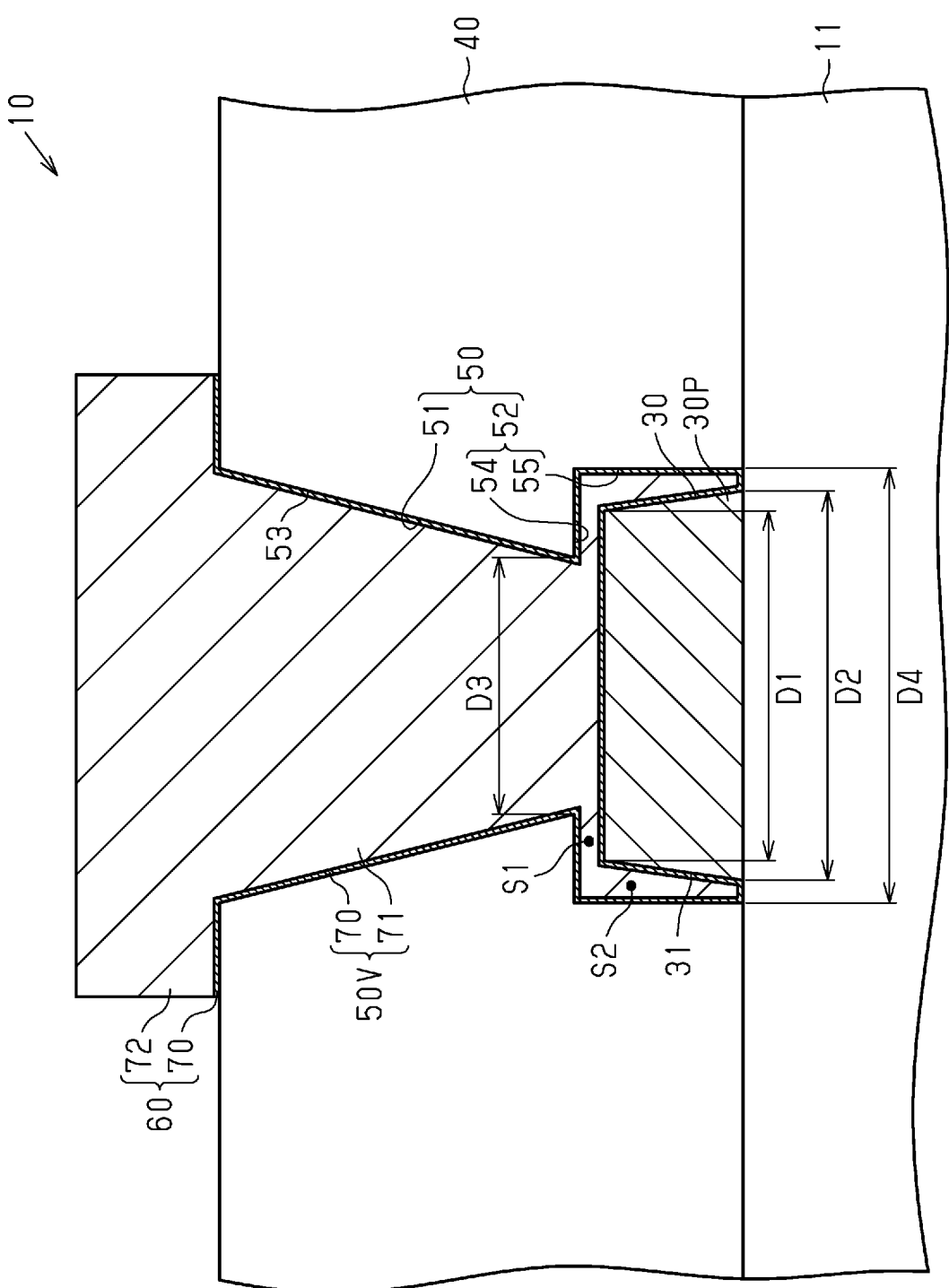
FIG. 2 is an enlarged cross-sectional view of a portion of the wiring substrate illustrated in FIG. 1.

With reference to FIG. 2, the structure of the wiring layer 30, the insulation layer 40, the through hole 50, the via wiring 50V, and the wiring layer 60 will now be described.
Structure of Wiring Layer 30

As illustrated in FIG. 2, the wiring layer 30 includes a pad 30P. In an example, the pad 30P is connected to another pad (not illustrated) via a wiring pattern (not illustrated) included in the wiring layer 30. The pad 30P may have any planar shape and any size. In an example, the pad 30P is circular in plan view.

In an example, the pad 30P is tapered so that the width (diameter in this embodiment) becomes smaller from the lower surface of the pad 30P toward the upper surface of the pad 30P. In an example, the pad 30P is truncated-cone-shaped so that a diameter D1 of the upper surface is smaller than a diameter D2 of the lower surface. In an example, the area of the upper surface of the pad 30P is smaller than the area of the lower surface of the pad 30P. The diameter D1 of the upper surface of the pad 30P may be, for example, approximately 60 μm to 100 μm. The diameter D2 of the lower surface of the pad 30P may be, for example, approximately 80 μm to 120 μm.

In an example, the pad 30P includes a side surface 31 that is inclined toward the center of the pad 30P in plan view from the lower surface of the pad 30P toward the upper surface of the pad 30P. In an example, in a cross-sectional view, the side surface 31 is a flat inclined surface that extends linearly with no step. However, the side surface 31 does not necessarily have to be flat. The side surface 31 may partially or entirely have an outward curve or an inward curve.

Structure of Through Hole 50

The through hole 50 includes a step at an intermediate position in the thickness-wise direction. The through hole 50 includes a step at the bottom of the through hole 50. The through hole 50 includes a first hole 51 located toward the upper surface of the insulation layer 40 and a second hole 52 located toward the lower surface of the insulation layer 40. The first hole 51 is continuous with the second hole 52. The first hole 51 includes a first wall 53 extending downward from the upper surface of the insulation layer 40. The second hole 52 includes a second wall 54 extending from the lower end of the first wall 53 to an outer side of the first hole 51 and a third wall 55 extending downward from the second wall 54. The first wall 53 of the first hole 51 and the second wall 54 and the third wall 55 of the second hole 52 form the step at the bottom of the through hole 50.

In the example illustrated in FIG. 2, the through hole 50 entirely exposes the upper surface of the pad 30P. Also, the through hole 50 entirely exposes the side surface 31 of the pad 30P. In an example, the through hole 50 entirely exposes the side surface 31 in the thickness-wise direction of the pad 30P and also exposes the side surface 31 along the entire perimeter of the pad 30P.

In an example, the first hole 51 is tapered so that the diameter is decreased from the upper side (the side of the upper surface of the insulation layer 40) toward the lower side (the side of the pad 30P) in FIG. 2. The first hole 51 has the form of an inverted truncated cone so that the diameter of the upper open end is larger than a diameter D3 of the lower open end. In an example, the diameter D3 of the lower open end of the first hole 51 is set to be smaller than the diameter D1 of the upper surface of the pad 30P. The diameter of the upper open end of the first hole 51 may be, for example, approximately 60 μm to 100 μm. The diameter D3 of the lower open end of the first hole 51 may be, for example, approximately 30 μm to 50 μm.

In an example, the first wall 53 of the first hole 51 extends downward from the upper open end (i.e., upper end) of the first hole 51 to the second hole 52. In an example, the first wall 53 is inclined downward from the upper surface of the insulation layer 40 toward an inner side of the first hole 51 (i.e., center of the first hole 51 in plan view). In an example, the first wall 53 is inclined toward the center of the first hole 51 in plan view from the upper surface of the insulation layer 40 toward the pad 30P. In an example, in a cross-sectional view, the first wall 53 is a flat inclined surface that extends linearly with no step. However, the first wall 53 does not necessarily have to be flat. The first wall 53 may partially or entirely have an outward curve or an inward curve.

The second hole 52 is continuous with the lower end of the first wall 53. The second hole 52 increases the width (in this embodiment, diameter) of the bottom opening of the first hole 51. The second hole 52 increases the width of the through hole 50 to be greater than the width of the first hole 51 at the lower end of the first wall 53. The second hole 52 is continuously formed along the entire perimeter of the first hole 51. The second hole 52 increases the width of the bottom opening of the first hole 51 along the entire perimeter of the first hole 51. The second hole 52 has a diameter D4 that is set to be larger than the diameter D3 of the lower end of the first hole 51. The diameter D4 of the second hole 52 is set to be larger than the diameter D1 of the upper surface of the pad 30P. The diameter D4 of the second hole 52 is set to be larger than the diameter D2 of the lower surface of the pad 30P.

In an example, the second wall 54 of the second hole 52 horizontally extends from the lower end of the first wall 53 to the outer side of the first hole 51 (in other words, in a direction away from the center of the first hole 51 in plan view). In an example, the second wall 54 extends parallel to the upper surface of the insulation layer 40. In an example, the second wall 54 extends parallel to the upper surface of the pad 30P. In an example, in a cross-sectional view, the second wall 54 is flat and stepless and extends linearly in a planar direction (in FIG. 2, sideward direction) orthogonal to the thickness-wise direction of the insulation layer 40. However, the second wall 54 does not necessarily have to be flat. The second wall 54 may partially or entirely have an outward curve or an inward curve.

The third wall 55 of the second hole 52 extends downward from the outer end of the second wall 54 to the upper surface of the substrate body 11. In plan view, the outer end of the second wall 54 is a portion of the second wall 54 located farthest from the lower end of the first wall 53. The third wall 55 extends, for example, perpendicular to the upper surface of the substrate body 11 in a cross-sectional view. The third wall 55 extends, for example, non-parallel to the side surface 31 of the pad 30P in a cross-sectional view. In an example, the third wall 55 is flat and stepless and extends linearly in the thickness-wise direction (in FIG. 2, vertical direction) of the insulation layer 40 in a cross-sectional view. However, the third wall 55 does not necessarily have to be flat. The third wall 55 may partially or entirely have an outward curve or an inward curve.

The second wall 54 of the second hole 52 is separated from the upper surface of the pad 30P in the thickness-wise direction of the insulation layer 40. The second wall 54 of the second hole 52 and the upper surface of the pad 30P are separated by a gap S1. The third wall 55 of the second hole 52 is separated from the side surface 31 of the pad 30P in the planar direction, which is orthogonal to the thickness-wise direction of the insulation layer 40. The third wall 55 of the second hole 52 and the side surface 31 of the pad 30P are separated by a gap S2. The gap S2 extends entirely in the thickness-wise direction of the pad 30P. The gap S2 entirely exposes the side surface 31 of the pad 30P in the thickness-wise direction of the pad 30P. In an example, the gap S2 narrows between the third wall 55 and the side surface 31 of the pad 30P from the upper surface of the pad 30P toward the lower surface of the pad 30P. In an example, the gaps S1 and S2 are continuously formed along the entire perimeter of the pad 30P. In an example, the gap S2 exposes the side surface 31 of the pad 30P along the entire perimeter of the pad 30P. The gap S2 entirely exposes the side surface 31 of the pad 30P.

Structure of Via Wiring 50V

The via wiring 50V fills the through hole 50. The via wiring 50V fills the first hole 51 and the second hole 52. The via wiring 50V fills the gap S1 and the gap S2. The via wiring 50V covers a lower surface of the insulation layer 40 that forms the second wall 54 of the second hole 52. Thus, the via wiring 50V extends into a lower portion of the insulation layer 40 in the second hole 52. In the example illustrated in FIG. 2, the via wiring 50V includes a tapered via conductor filling the first hole 51 and a tubular via conductor (in FIG. 2, circular tubular via conductor) filling the second hole 52 and formed integrally with the tapered via conductor. The tubular via conductor entirely covers the upper surface of the pad 30P and the side surface 31 of the pad 30P.

The via wiring 50V entirely covers the upper surface of the pad 30P exposed from the through hole 50. The via wiring 50V entirely covers the side surface 31 of the pad 30P exposed from the through hole 50. The via wiring 50V entirely covers the upper surface of the substrate body 11 exposed from the second hole 52.

In an example, the via wiring 50V includes a seed layer 70 and a metal layer 71. The seed layer 70 covers the wall of the through hole 50, the upper surface of the substrate body 11 exposed from the through hole 50, and the upper surface and the side surface 31 of the pad 30P exposed from the through hole 50. The metal layer 71 is formed on the seed layer 70 and fills the through hole 50.

In an example, the seed layer 70 continuously covers the entire wall of the through hole 50, the entire upper surface of the substrate body 11 exposed from the through hole 50, and the entire upper surface and the entire side surface 31 of the pad 30P exposed from the through hole 50. In an example, the seed layer 70 continuously covers the upper surface of the insulation layer 40, the entire first wall 53, the entire second wall 54, the entire third wall 55, the entire upper surface of the substrate body 11 exposed in the bottom of the second hole 52, the entire side surface 31, and the entire upper surface of the pad 30P. The material of the seed layer 70 may be, for example, copper or a copper alloy. The seed layer 70 may be, for example, an electroless plating metal layer formed through an electroless plating process.

In an example, the metal layer 71 is formed on the seed layer 70 and fills the first hole 51 and the second hole 52. The metal layer 71 fills the gaps S1 and S2 of the second hole 52 including the seed layer 70. The portion of the metal layer 71 filling the gap S1 is sandwiched between the seed layer 70 that covers the second wall 54 and the seed layer 70 that covers the upper surface of the pad 30P in the thickness-wise direction of the insulation layer 40. The portion of the metal layer 71 filling the gap S2 is sandwiched between the seed layer 70 that covers the third wall 55 and the seed layer 70 that covers the side surface 31 of the pad 30P in the planar direction. The material of the metal layer 71 may be, for example, copper or a copper alloy. The metal layer 71 may be, for example, a metal layer formed through an electrolytic plating process, that is, an electrolytic plating metal layer.

The seed layer 70 and the metal layer 71, which are formed in the through hole 50, form the via wiring 50V.

Structure of Wiring Layer 60

In an example, the wiring layer 60 includes the seed layer 70 formed on the upper surface of the insulation layer 40 and a metal layer 72 formed on the seed layer 70 and the via wiring 50V (the metal layer 71). The metal layer 72, for example, projects upward from the upper surface of the insulation layer 40. The metal layer 72 is formed, for example, continuously and integrally with the metal layer 71. The material of the metal layer 72 may be, for example, copper or a copper alloy. The metal layer 72 may be, for example, an electrolytic plating metal layer formed through an electrolytic plating process.

As described above, the wiring layer 30 and the wiring layer 60 are electrically connected by the via wiring 50V, which fills the first hole 51 and the second hole 52.

In FIG. 2, the corner of the first wall 53 with the second wall 54 and the corner of the second wall 54 with the third wall 55 form an edge. However, the actual corner of the first wall 53 with the second wall 54 and the actual corner of the second wall 54 with the third wall 55 may have a curved surface. In the subsequent drawings, in the same manner as FIG. 2, the corner of the first wall 53 with the second wall 54 and the corner of the second wall 54 with the third wall 55 form an edge.

The wiring substrate 10 may be inverted when used or may be arranged at any angle.

A method for manufacturing the wiring substrate 10 will now be described with reference to FIGS. 3 to 12. The method for manufacturing the through hole 50 of the wiring substrate 10, the via wiring 50V, and the wiring layer 60 will be described in detail. To facilitate understanding, portions that ultimately become elements of the wiring substrate 10 are indicated by reference characters used to denote the final elements.

Figure 3:
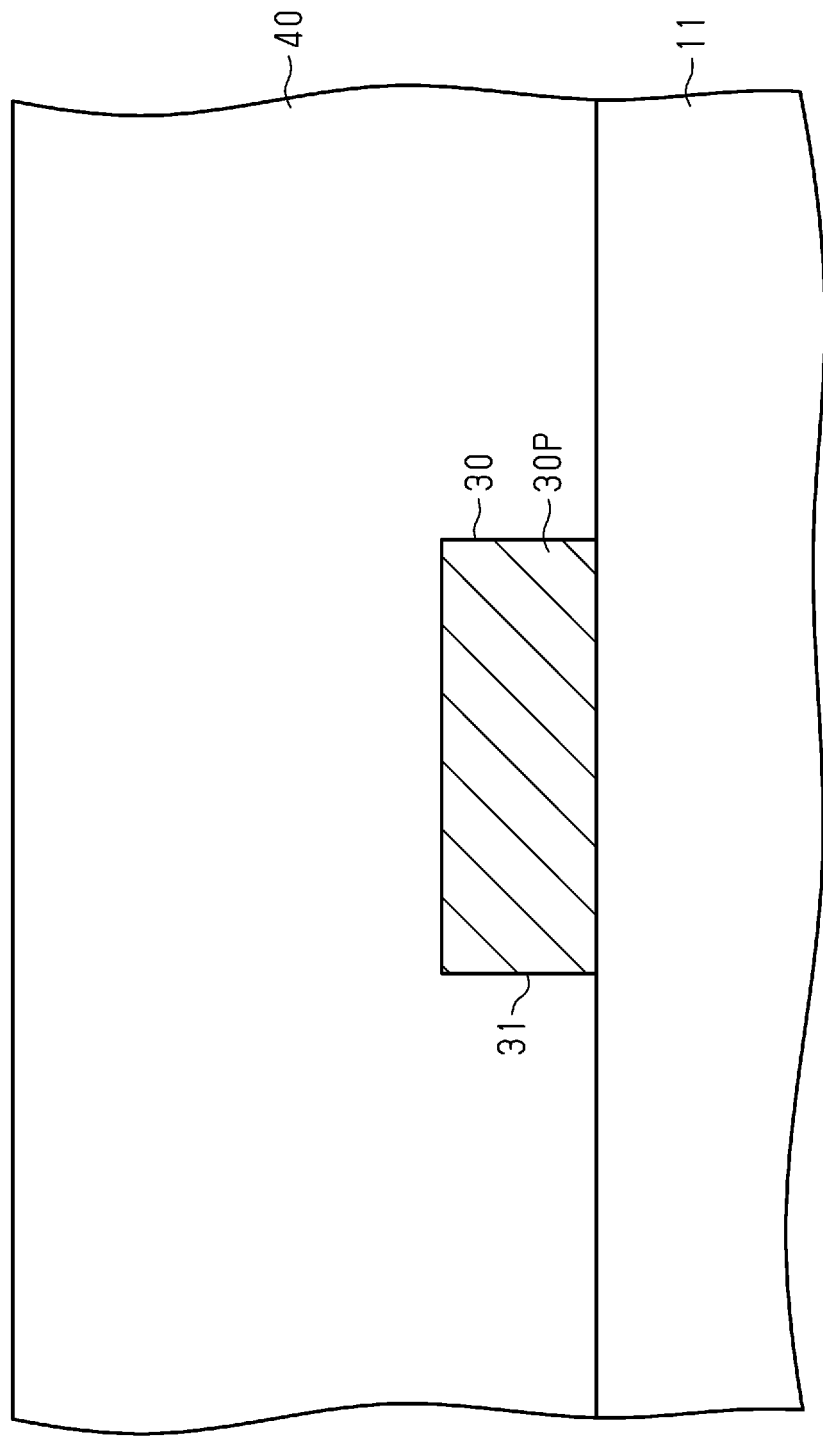
FIGS. 3, 4, 5, 6, 7, 8, 9, 10, 11, and 12 are schematic cross-sectional views illustrating a method for manufacturing the wiring substrate illustrated in FIG. 1.

As illustrated in FIG. 3, a structural body is prepared. In the structural body, the wiring layer 30 including the pad 30P is formed on the upper surface of the substrate body 11, and the insulation layer 40 is formed on the upper surface of the substrate body 11 to cover the entire surface (upper surface and side surface) of the wiring layer 30. The structural body may be manufactured through a known manufacturing method and thus will not be described in detail. In this step, the side surface 31 of the pad 30P extends perpendicular to the upper surface of the substrate body 11 in a cross-sectional view.

Figure 4:
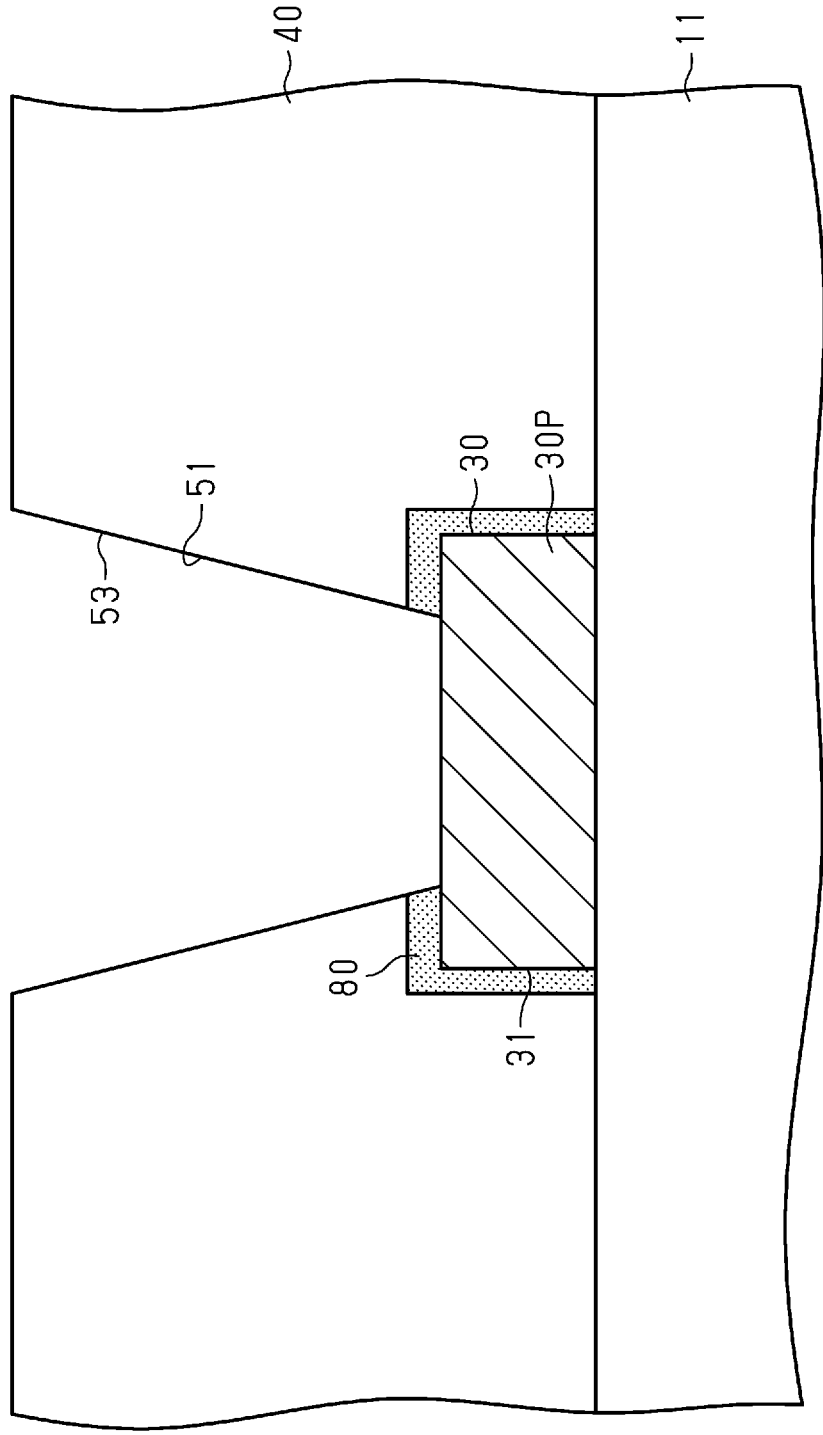

In the step illustrated in FIG. 4, the first hole 51 is formed in the insulation layer 40 to partially expose the upper surface of the pad 30P of the wiring layer 30. In an example, the first hole 51 is formed by irradiating the insulation layer 40 with a laser beam. That is, the first hole 51 may be formed by laser drilling. Examples of a laser beam source used for the laser beam irradiation may be a $CO_2$ layer and a UV-YAG layer.

The intensity (energy) of a laser beam emitted to the insulation layer 40 is set to a value sufficient to form the first hole 51 having a desired diameter with a single shot, or a single time of irradiation. For example, a laser beam having energy needed to form the first hole 51 in an insulation layer 40 that does not include an inorganic filler needs to be emitted multiple times (e.g., three times or more) to form the first hole 51 in an insulation layer 40 that includes an inorganic filler. Hence, for example, when the insulation layer 40 includes an inorganic filler, a laser beam having energy corresponding to the multiple times of laser beam irradiation is used in a single time of irradiation.

When the insulation layer 40 is irradiated with the laser beam, the wiring layer 30 is heated by the energy of the laser beam. The heat of the wiring layer 30 transforms a part 80 of the insulation layer 40 that is in contact with the upper surface of the pad 30P and the side surface 31. In the description hereafter, the "part 80" may be referred to as the "transformed part 80." The heat of the wiring layer 30 transmits from a point that is irradiated with the laser beam, that is, a central part of the first hole 51, to the periphery. The transformed part 80 is formed along the entire perimeter of the first hole 51. The transformed part 80 extends to the lower end of the side surface 31 of the pad 30P, that is, the lower surface of the insulation layer 40. Transformation of the part 80 of the insulation layer 40 includes, for example, melting of resin in the insulation layer 40 and a thermal decomposition resulting from carbonization of resin in the insulation layer 40.

Figure 5:
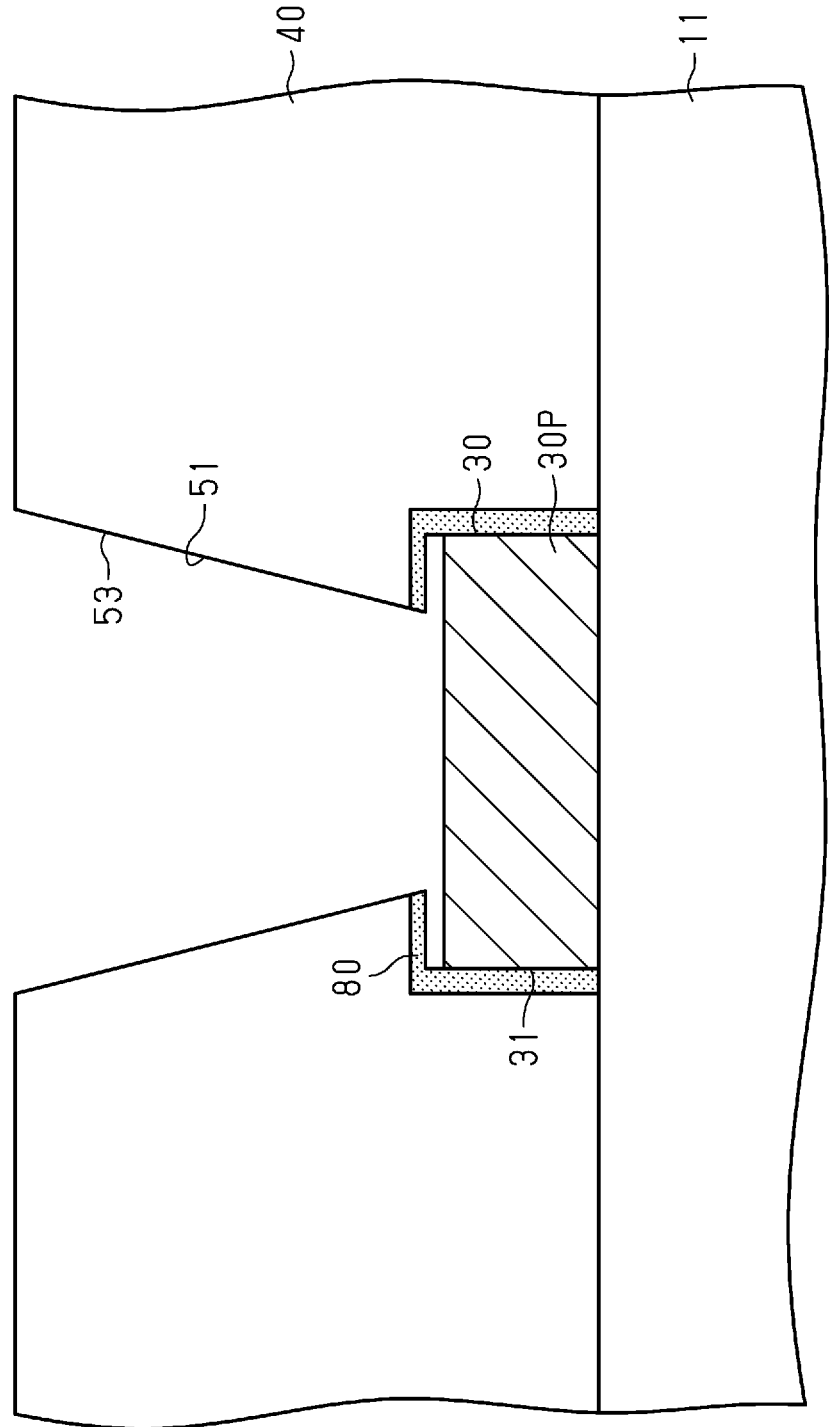

In the step illustrated in FIG. 5, a first desmear process is performed to remove resin smear (resin residue) from the upper surface of the wiring layer 30 exposed in the bottom of the first hole 51. The first desmear process may be performed, for example, using a permanganate process. The first desmear process partially removes the transformed part 80. In the example illustrated in FIG. 5, the first desmear process partially removes the transformed part 80 from where the transformed part 80 is exposed from the first wall 53 in the first hole 51. As a result, the width of the bottom opening of the first hole 51 is increased.

Figure 6:
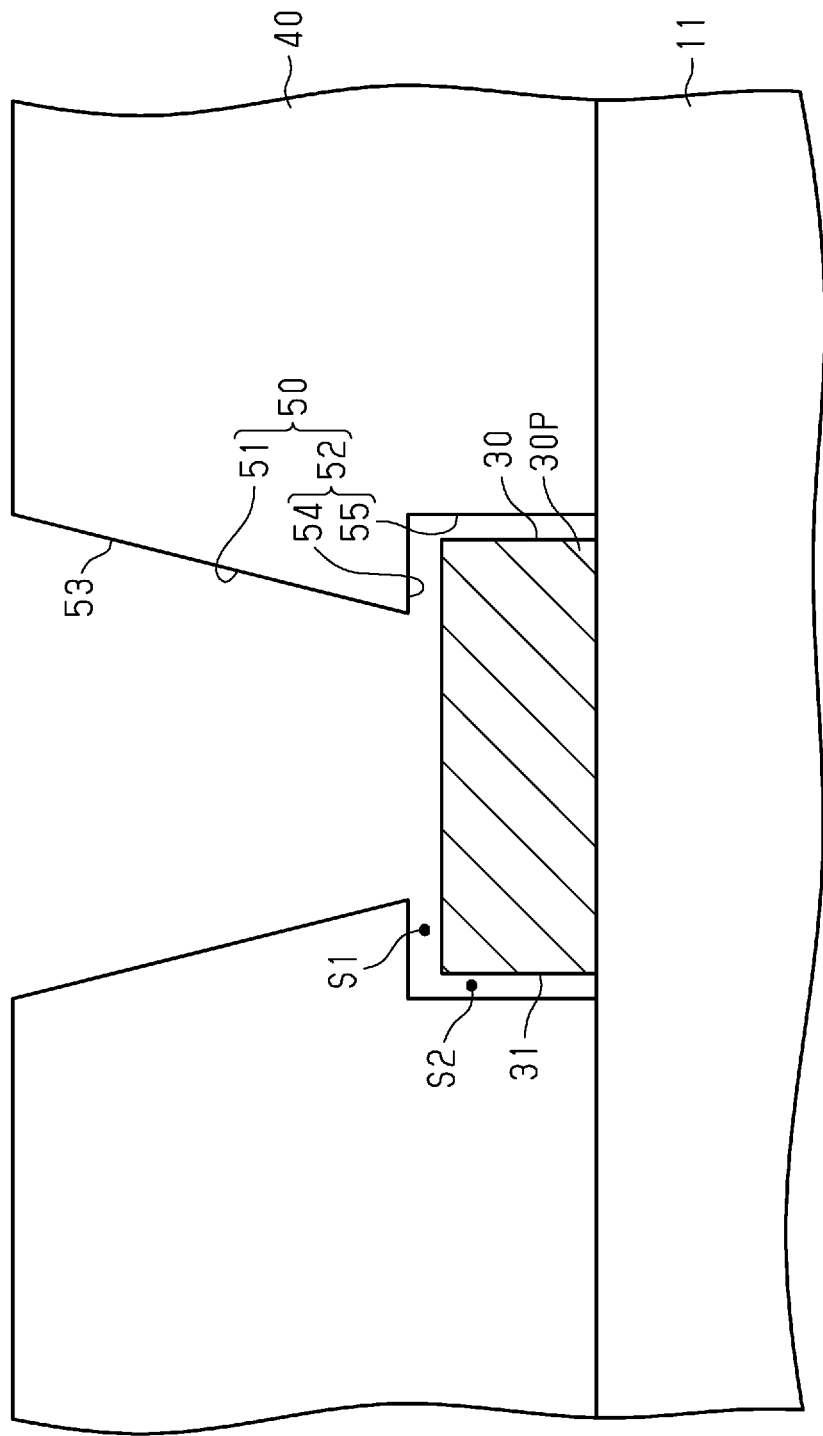

In the step illustrated in FIG. 6, a second desmear process that differs from the first desmear process is performed to form the second hole 52 that is continuous with the first hole 51. The second desmear process may be performed, for example, using a permanganate process. The processing condition of the second desmear process such as a process time is set to differ from that of the first desmear process. The second desmear process further increases the width of the bottom opening of the first hole 51. In the example illustrated in FIG. 6, the second desmear process removes the remaining transformed part 80 (refer to FIG. 5). This forms the second hole 52 that is continuous with the bottom of the first hole 51 and entirely exposes the side surface 31 of the pad 30P. As a result of formation of the second hole 52, the gap S1 is formed between the upper surface of the pad 30P and the second wall 54 of the second hole 52, and the gap S2 is formed between the side surface 31 of the pad 30P and the third wall 55 of the second hole 52. The second wall 54 is shaped in conformance with the upper surface of the pad 30P. The third wall 55 is shaped in conformance with the side surface 31 of the pad 30P. In other words, the second wall 54 extends parallel to the upper surface of the pad 30P in the planar direction. The third wall 55 extends parallel to the side surface 31 of the pad 30P in the thickness-wise direction of the insulation layer 40.

In the manufacturing steps described above, the through hole 50 in which the first hole 51 is continuous with the second hole 52 exposing the side surface 31 of the pad 30P is formed in the insulation layer 40.

Figure 7:
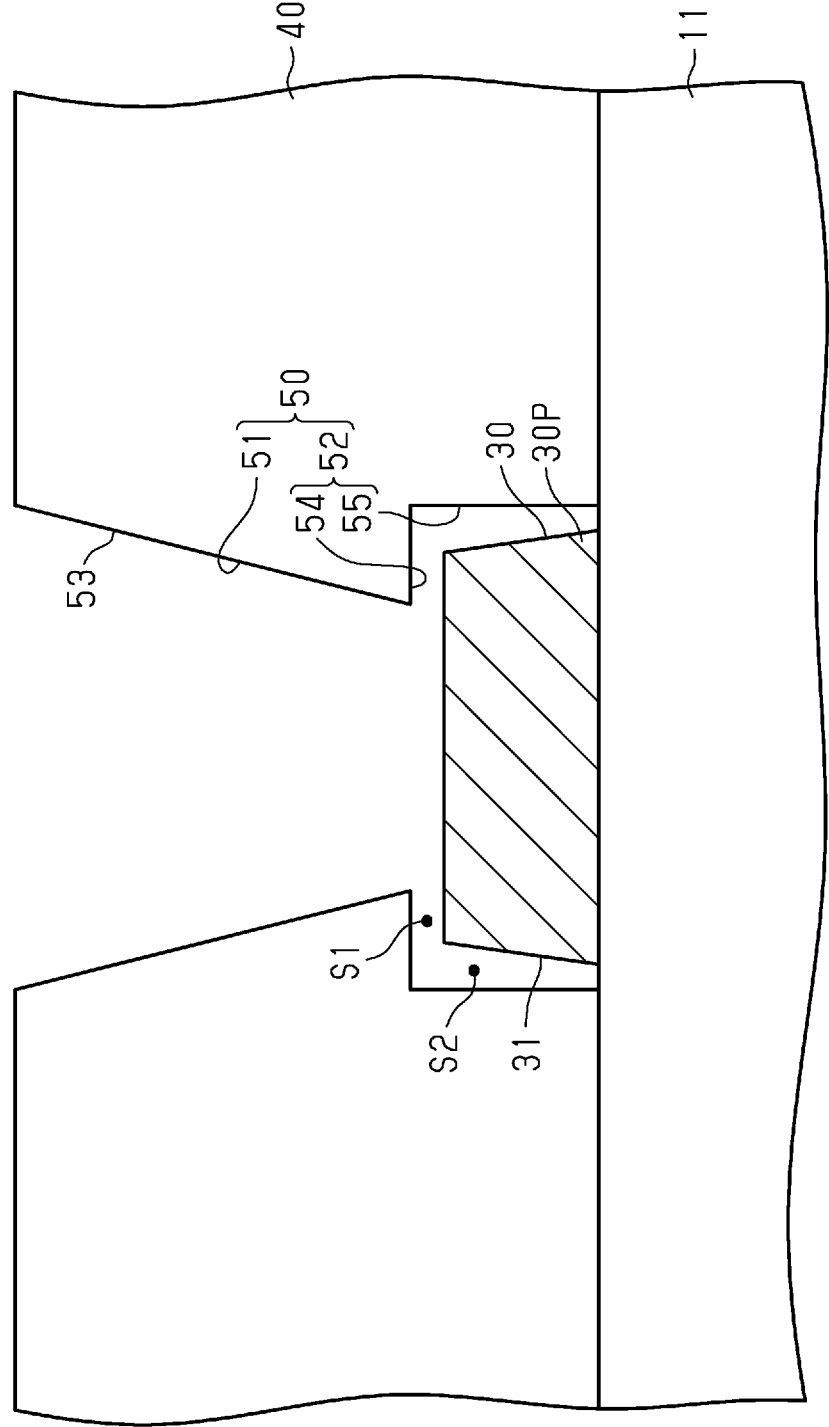

In the step illustrated in FIG. 7, the pad 30P is etched as a process performed prior to electroless plating. In this step, the pad 30P is partially etched to widen the gaps S1 and S2. In an example, the insulation layer 40 is used as the etching mask, and the wiring layer 30 is partially etched and removed. In the example illustrated in FIG. 7, the upper surface of the pad 30P and the side surface 31 of the pad 30P are partially etched and removed. This decreases the size of the pad 30P from the side of the upper surface of the pad 30P and the side of the side surface 31. The decrease in the size of the pad 30P widens the gaps S1 and S2. As a result of this etching process, the side surface 31 of the pad 30P is formed as an inclined surface that is inclined toward the third wall 55 from the upper surface of the pad 30P toward the lower surface of the pad 30P.

Figure 8:
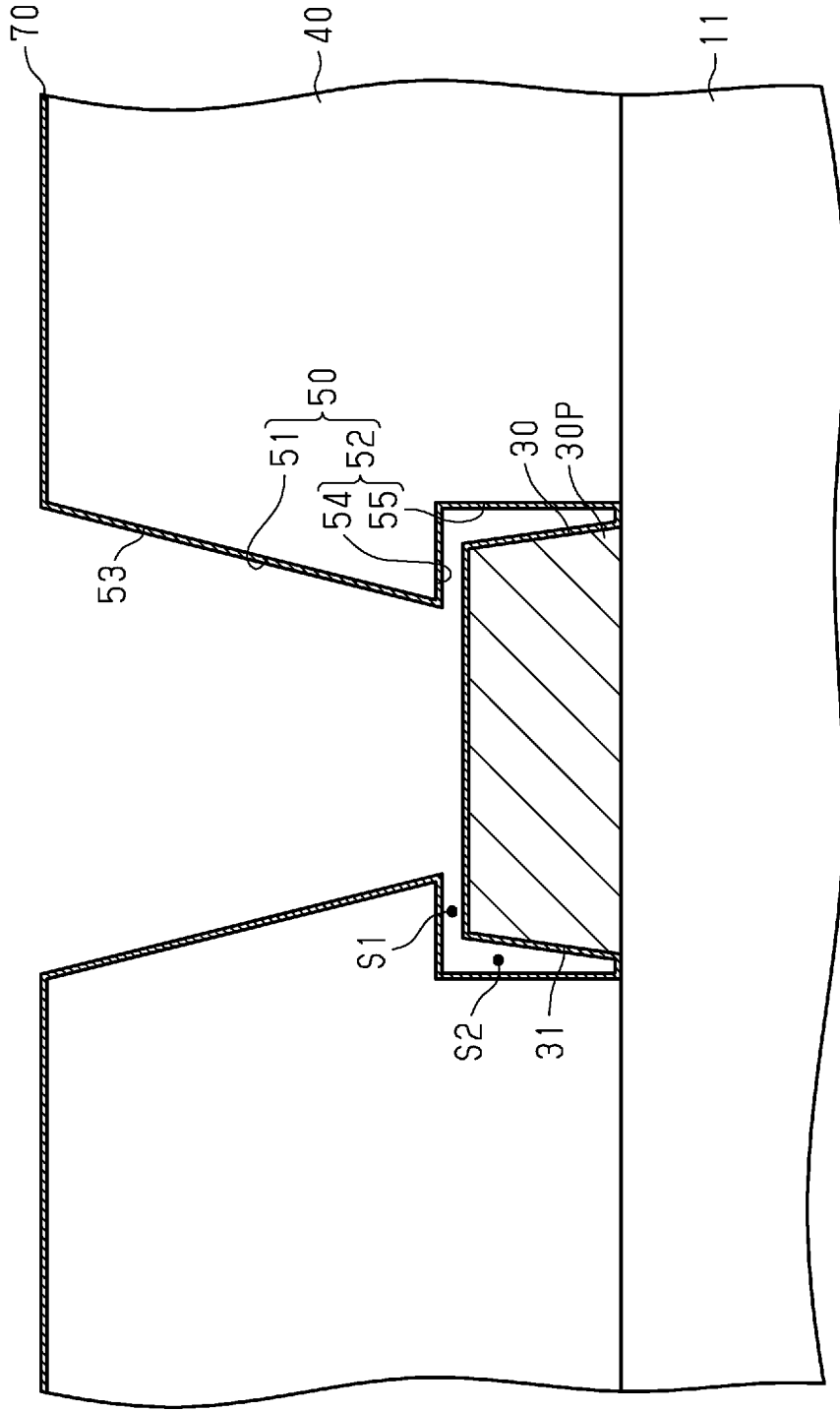

In the step illustrated in FIG. 8, the seed layer 70 is formed to continuously cover the entire upper surface of the insulation layer 40, the entire wall of the first hole 51, the entire wall of the second hole 52, the entire upper surface of the substrate body 11 exposed from the second hole 52, and the entire surface (upper surface and the side surface 31) of the pad 30P. The seed layer 70 may be formed, for example, through an electroless plating process. The seed layer 70 may be formed, for example, through an electroless copper plating process using a plating solution including a mixture of copper sulfate, sodium hydroxide, carboxylate, nickel sulfate, and formaldehyde.

Figure 9:
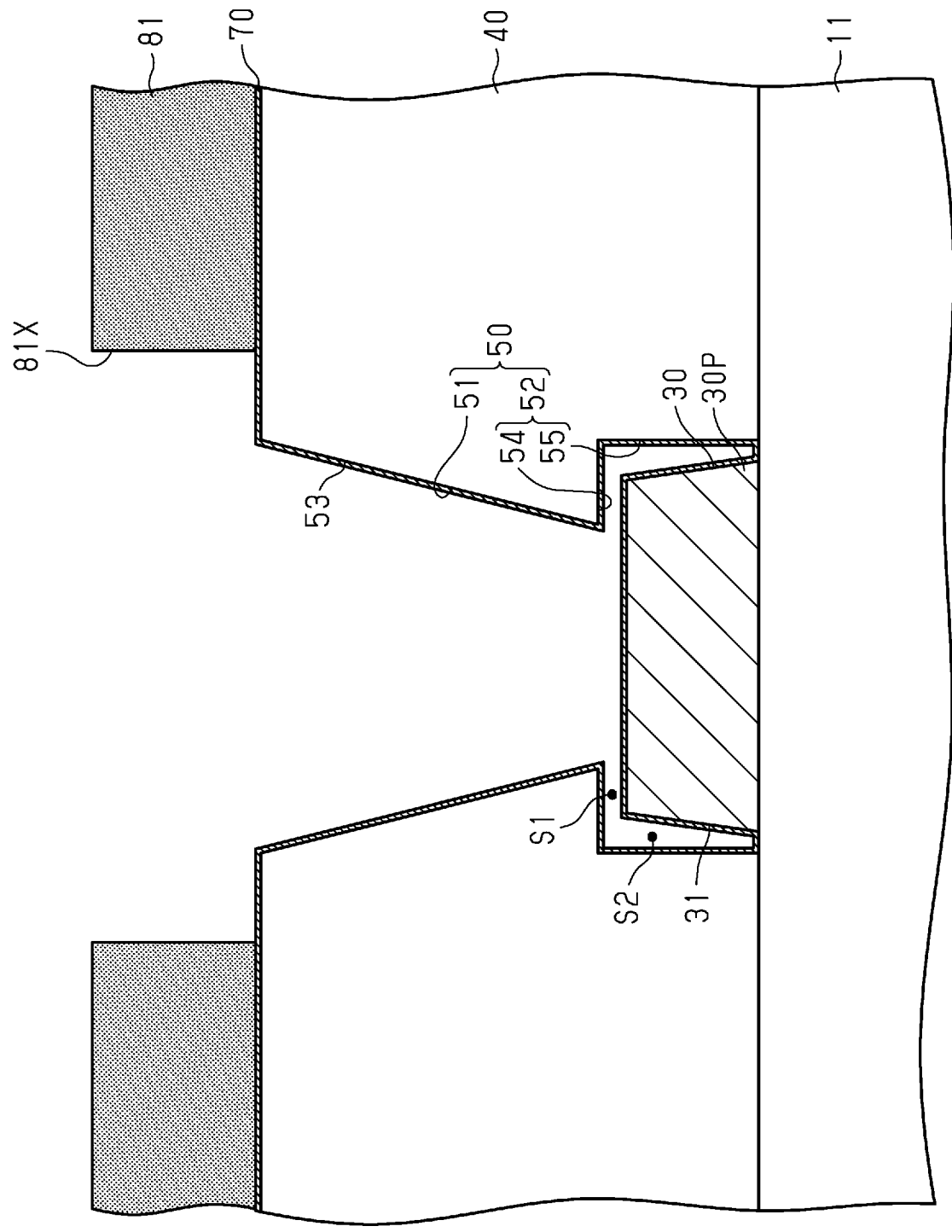

In the step illustrated in FIG. 9, a resist layer 81 that includes an open pattern 81X is formed on the seed layer 70 formed on the upper surface of the insulation layer 40. The open pattern 81X exposes a portion of the seed layer 70 corresponding to a region in which the wiring layer 60 (refer to FIG. 2) is formed. For example, a material having resistance to the electrolytic plating process performed in the next step may be used as the material of the resist layer 81. The material of the resist layer 81 may be, for example, a photosensitive dry film resist or a liquid photoresist (e.g., dry film resist or liquid resist of novolac resin or acrylic resin). For example, when a photosensitive dry film resist is used, the upper surface of the seed layer 70 is laminated with a dry film through thermocompression bonding, and the dry film is patterned through photolithography to form the resist layer 81 including the open pattern 81X. When a liquid photoresist is used, the resist layer 81 may also be formed by the same steps.

Figure 10:
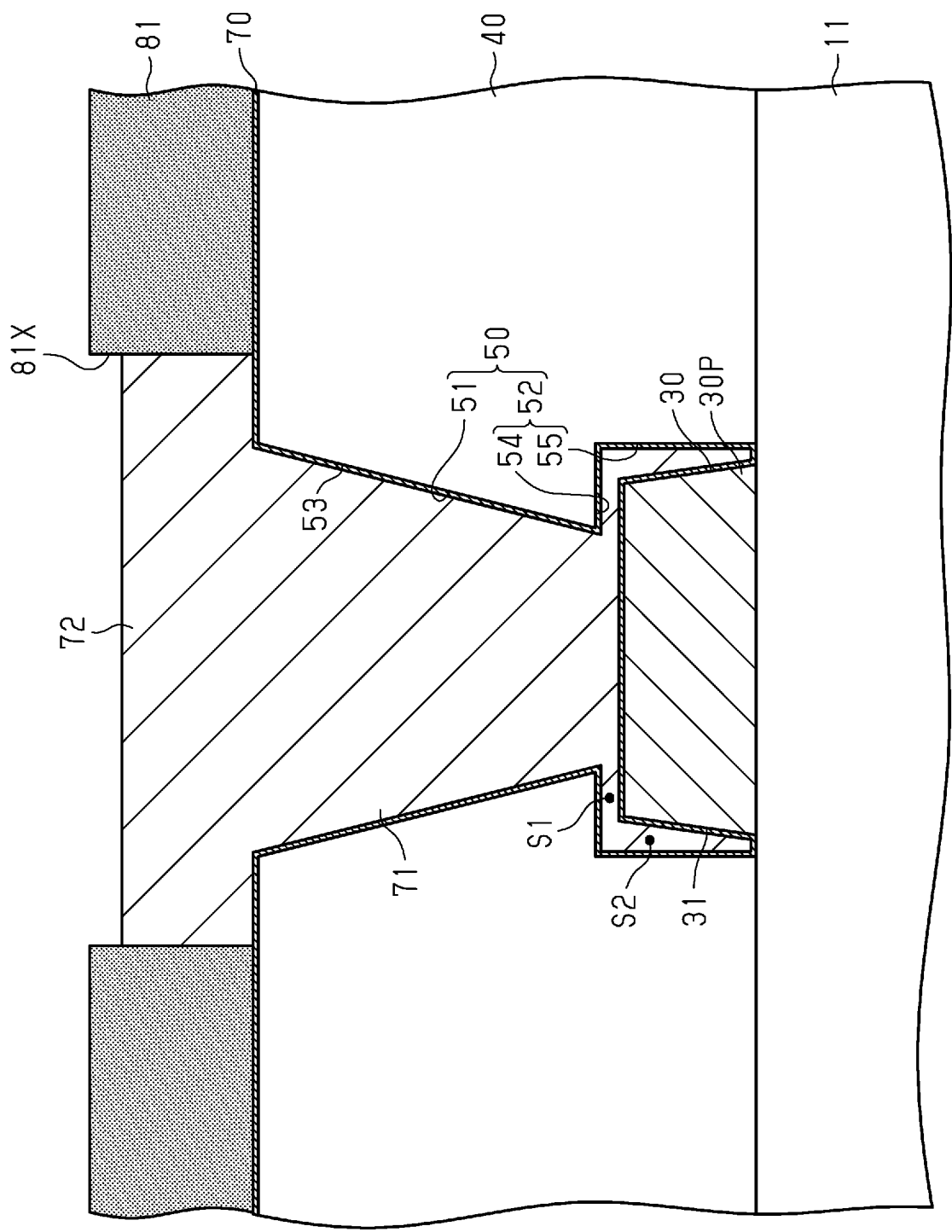

In the step illustrated in FIG. 10, the electrolytic plating process is performed on the seed layer 70 using the resist layer 81 as a plating mask and the seed layer 70 as a plating power feeding layer. That is, the electrolytic plating process (e.g., electrolytic copper plating process) is performed on the upper surface of the seed layer 70 exposed from the open pattern 81X in the resist layer 81. This step forms the metal layer 71 filling the through hole 50 at an inner side of the seed layer 70 and also forms the metal layer 72 in the open pattern 81X. In this step, the metal layer 71 fills the first hole 51 and the second hole 52 including the gaps S1 and S2. The metal layer 72 is formed continuously and integrally with the metal layer 71.

Figure 11:
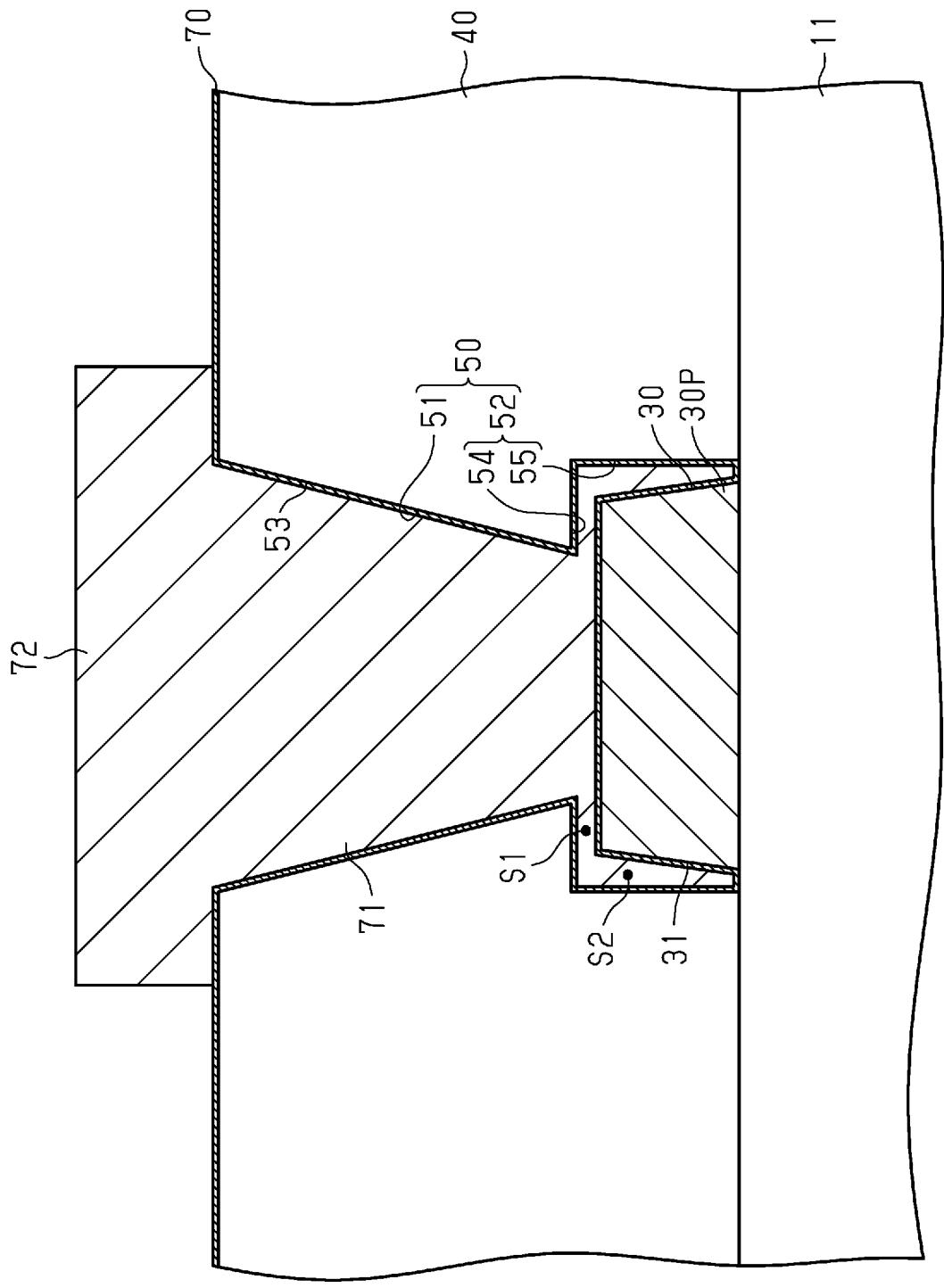

In the step illustrated in FIG. 11, the resist layer 81 illustrated in FIG. 10 is removed using an alkaline stripping solution (e.g., organic amine-based stripping solution, caustic soda, acetone, or ethanol).

Figure 12:
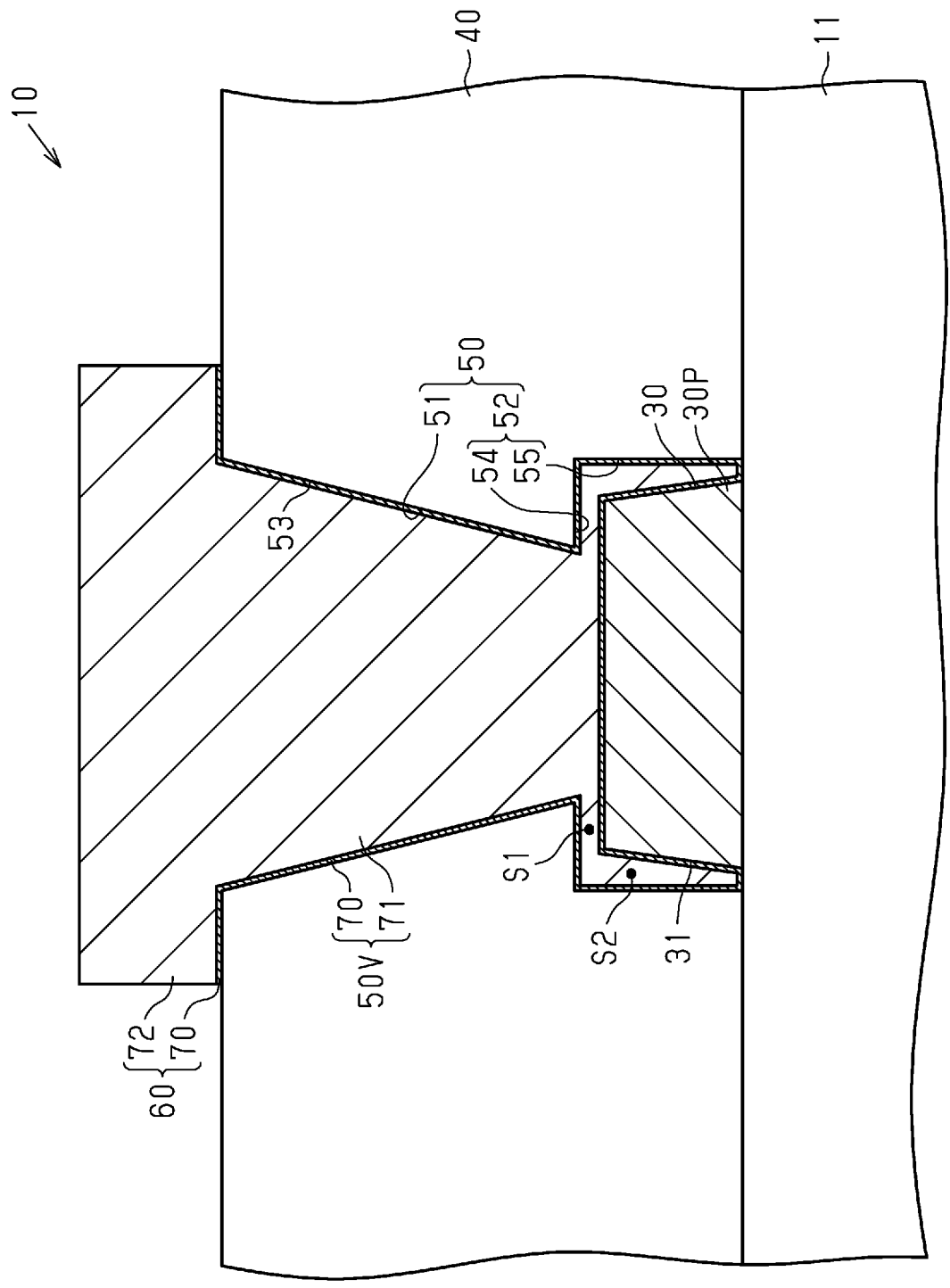

In the step illustrated in FIG. 12, the metal layer 72 is used as an etching mask to etch and remove an unwanted portion of the seed layer 70. When the seed layer 70 is an electroless copper plating layer, the unwanted portion of the seed layer 70 is removed by wet etching using a sulfuric acid-hydrogen peroxide-based etchant.

In the manufacturing steps described above, the via wiring 50V including the seed layer 70 and the metal layer 71 is formed in the through hole 50. In addition, the wiring layer 60 including the seed layer 70 and the metal layer 72 formed on the upper surface of the insulation layer 40 is formed.

The Wiring Substrate 10 has the Following Advantages.

(1) The wiring substrate 10 includes the substrate body 11, the wiring layer 30 formed on the upper surface of the substrate body 11 and including the pad 30P, and the insulation layer 40 formed on the upper surface of the substrate body 11 to cover the wiring layer 30. The wiring substrate 10 includes the first hole 51 extending through the insulation layer 40 in the thickness-wise direction and exposing a portion of the upper surface of the pad 30P. The wiring substrate 10 includes the second hole 52 formed in the insulation layer 40 to be continuous with the first hole 51 so that the second hole 52 increases the width of the bottom opening of the first hole 51 and entirely exposes the side surface 31 of the pad 30P in the thickness-wise direction of the pad 30P. The wiring substrate 10 includes the via wiring 50V filling the first hole 51 and the second hole 52, and the wiring layer 60 formed on the upper surface of the insulation layer 40 integrally with the via wiring 50V.

In this structure, the first hole 51 and the second hole 52, continuous with the first hole 51, are formed in the insulation layer 40 so that the second hole 52 increases the width of the bottom opening of the first hole 51 and entirely exposes the side surface 31 of the pad 30P in the thickness-wise direction of the pad 30P. The first hole 51 and the second hole 52 are filled with the via wiring 50V. Thus, the via wiring 50V is bonded to the upper surface of the pad 30P exposed from the first hole 51 and the second hole 52. The via wiring 50V is also bonded to the side surface 31 of the pad 30P exposed from the second hole 52. In this structure, the area of the via wiring 50V that is bonded to the pad 30P is increased as compared to, for example, in a structure in which the via wiring 50V is bonded to the upper surface of the pad 30P exposed from only the first hole 51. This improves the bonding strength between the via wiring 50V and the pad 30P and thus the electrical connection reliability between the via wiring 50V and the pad 30P.

In addition, the area of the via wiring 50V bonded to pad 30P is increased. This effectively disperses thermal stress applied to the interface between the via wiring 50V and the pad 30P, for example, in a thermal cycle reliability test. For example, the bonding of the side surface 31 of the pad 30P to the via wiring 50V allows for dispersion of thermal stress in the planar direction. This appropriately limits formation of cracks in the interface between the via wiring 50V and the pad 30P caused by thermal stress. As a result, the electrical connection reliability between the via wiring 50V and the pad 30P is improved.

(2) The second hole 52 partially exposes the upper surface of the substrate body 11. Thus, the via wiring 50V filling the second hole 52 is in contact with the portion of the upper surface of the substrate body 11. In this structure, for example, when thermal stress is applied to the via wiring 50V in a thermal cycle reliability test, the thermal stress is dispersed to the substrate body 11. This limits formation of cracks in the via wiring 50V caused by thermal stress. As a result, the electrical connection reliability between the via wiring 50V and the pad 30P is improved.

(3) The width of the second hole 52 is larger than the width of the bottom opening of the first hole 51. In this structure, the width of the bottom opening of the through hole 50, including the first hole 51 and the second hole 52, is increased. This increases the area of the upper surface of the pad 30P exposed in the bottom of the through hole 50. Thus, the area of the via wiring 50V bonded to the upper surface of the pad 30P is increased. As a result, the electrical connection reliability between the via wiring 50V and the pad 30P is improved.

(4) The first hole 51 includes the first wall 53 extending downward from the upper surface of the insulation layer 40. The second hole 52 includes the second wall 54 extending from the lower end of the first wall 53 to the outer side of the first hole 51 and the third wall 55 extending downward from the outer end of the second wall 54 to the upper surface of the substrate body 11. The portion of the via wiring 50V filling the second hole 52 covers the lower surface of the insulation layer 40 that forms the second wall 54. Thus, the via wiring 50V partially overlaps the insulation layer 40 in plan view. This effectively limits separation of the via wiring 50V from the insulation layer 40.

(5) The side surface 31 of the pad 30P is inclined toward the third wall 55 of the second hole 52 from the upper surface of the pad 30P toward the lower surface of the pad 30P. The area of the side surface 31 of the pad 30P that is bonded to the via wiring 50V is increased as compared to a structure in which the side surface 31 of the pad 30P perpendicularly extends on the upper surface of the substrate body 11. As a result, the electrical connection reliability between the via wiring 50V and the pad 30P is improved.

(6) The second hole 52 is formed along the entire perimeter of the pad 30P. Thus, the entirety of the side surface 31 of the pad 30P is exposed from the second hole 52. In other words, the entirety of the side surface 31 is exposed from the second hole 52 along the perimeter of the pad 30P. Also, the entirety of the side surface 31 is exposed from the second hole 52 in the thickness-wise direction of the pad 30P. The via wiring 50V, filling the second hole 52, covers the entirety of the side surface 31 of the pad 30P. Thus, the area of the side surface 31 of the pad 30P that is bonded to the via wiring 50V is increased. This improves the electrical connection reliability between the via wiring 50V and the pad 30P.

Other Embodiments

The embodiment described above may be modified as follows. The embodiment and the following modified examples may be combined within a scope in which the combined modified examples remain technically consistent with each other.

In the embodiment, the shape of the second hole 52 may be changed.

Figure 13:
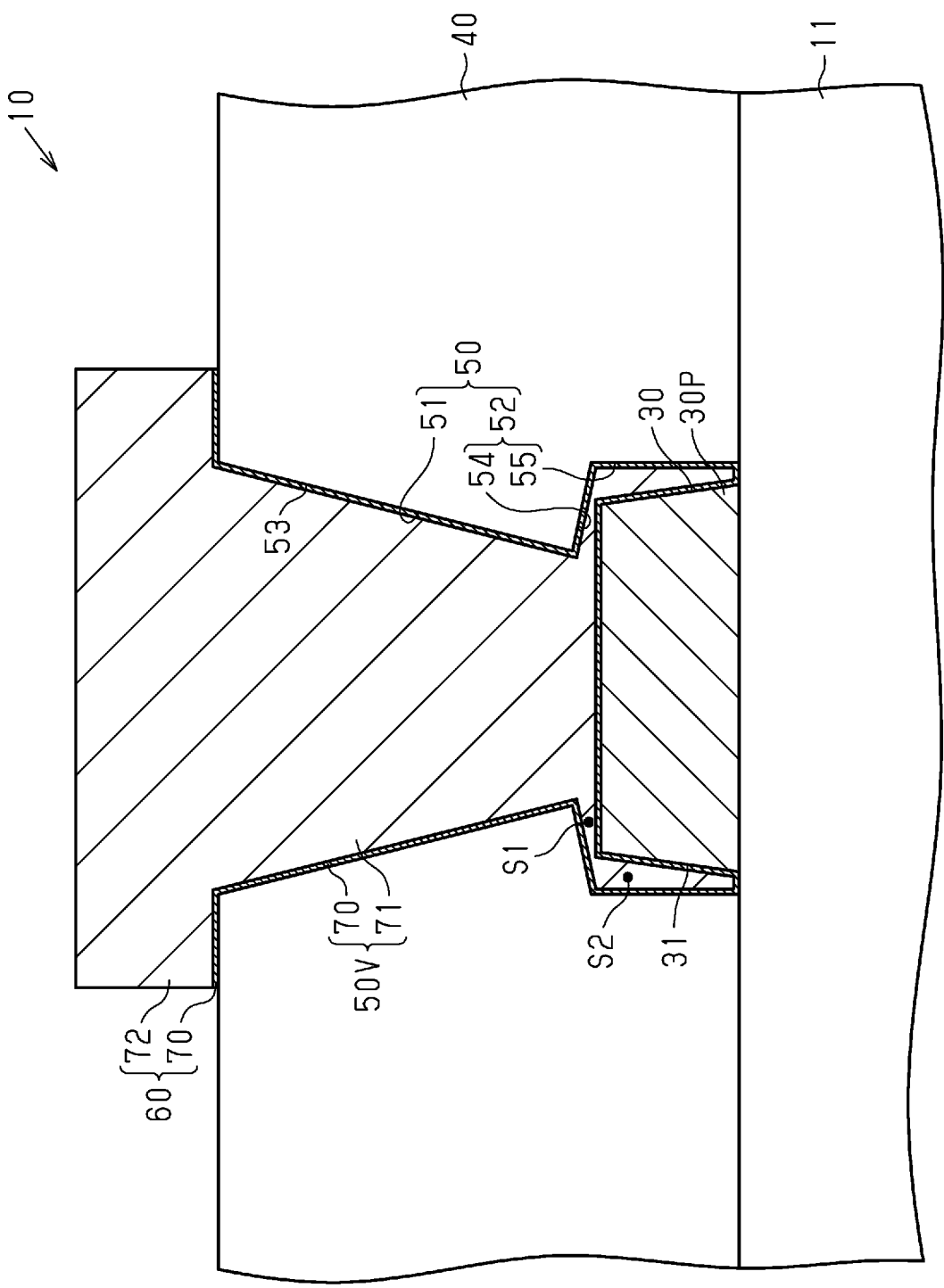
FIG. 13 is an enlarged cross-sectional view illustrating a portion of a wiring substrate in a modified example.

In an example, as illustrated in FIG. 13, the second wall 54 of the second hole 52 may be inclined downward from the lower end of the first wall 53 toward the outer side of the first hole 51. In an example, in a cross-sectional view, the second wall 54 is a flat inclined surface that extends linearly with no step. However, the second wall 54 does not necessarily have to be flat. The second wall 54 may partially or entirely have an outward curve or an inward curve. The gap S1 narrows between the second wall 54 and the upper surface of the pad 30P from the lower end of the first wall 53 toward the outer end of the second wall 54.

In the above embodiment, the third wall 55 of the second hole 52 extends perpendicular to the upper surface of the substrate body 11. Alternatively, the third wall 55 may include an inclined surface. In an example, the third wall 55 may include an inclined surface that is inclined toward the side surface 31 of the pad 30P from the outer end of the second wall 54 toward the upper surface of the substrate body 11.

In the embodiment, the second hole 52, which entirely exposes the side surface 31 of the pad 30P in the thickness-wise direction of the pad 30P, is formed along the entire perimeter of the pad 30P. However, the range of the second hole 52 may be changed. In an example, the second hole 52 may be formed partially along the perimeter of the pad 30P. In this structure, while a portion of the side surface 31 of the pad 30P is exposed in the second hole 52, the remaining portion of the side surface 31 is covered by the insulation layer 40.

In the embodiment, the shape of the first hole 51 may be changed.

Figure 14:
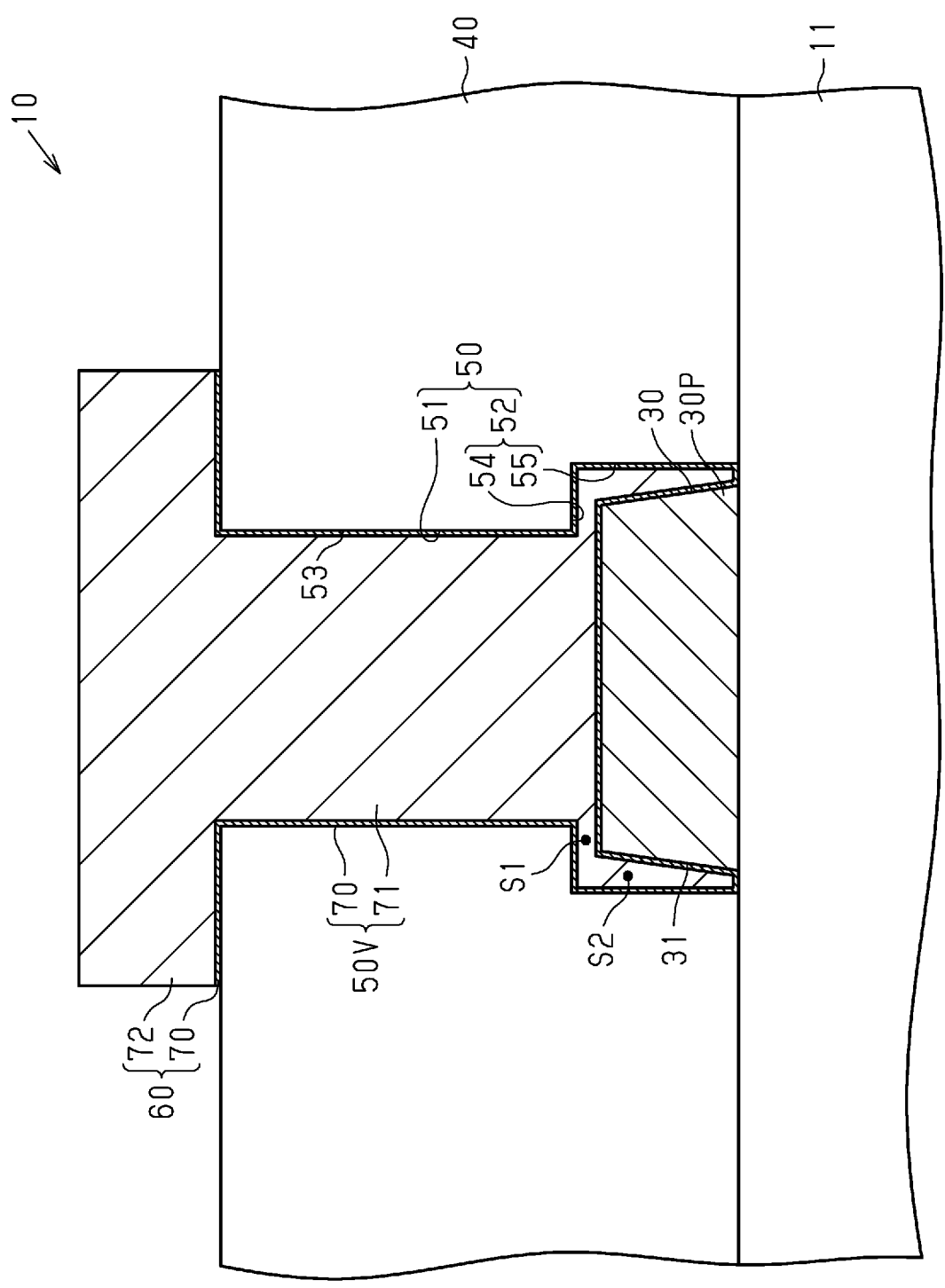
FIG. 14 is an enlarged cross-sectional view illustrating a portion of a wiring substrate in another modified example.

In an example, as illustrated in FIG. 14, the first wall 53 of the first hole 51 may extend perpendicular to the upper surface of the insulation layer 40.

In the above embodiment, the diameter D3 of the lower open end of the first hole 51 is set to be smaller than the diameter D1 of the upper surface of the pad 30P. Alternatively, for example, the diameter D3 may be set to be greater than or equal to the diameter D1.

In the above embodiment, the insulation layer 40 may include a reinforcement material. The material of the insulation layer 40 may be, for example, a glass epoxy resin obtained by impregnating a glass cloth (glass woven cloth), which is a reinforcement material, with a thermosetting insulative resin including epoxy resin as a main component and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to epoxy resin and may be, for example, an insulative resin such as polyimide resin or cyanate resin.

In the above embodiment, the shape of the pad 30P may be changed. In an example, the diameter D1 of the upper surface of the pad 30P may be set to be equal the diameter D2 of the lower surface of the pad 30P. In this structure, the side surface 31 of the pad 30P extends, for example, perpendicular to the upper surface of the substrate body 11.

In the above embodiment, the via wiring 50V connects the outermost wiring layer 60 and the wiring layer 30, which is arranged in an inner side of the wiring layer 60. However, the via wiring 50V is not limited to such a via wiring.

Figure 15:
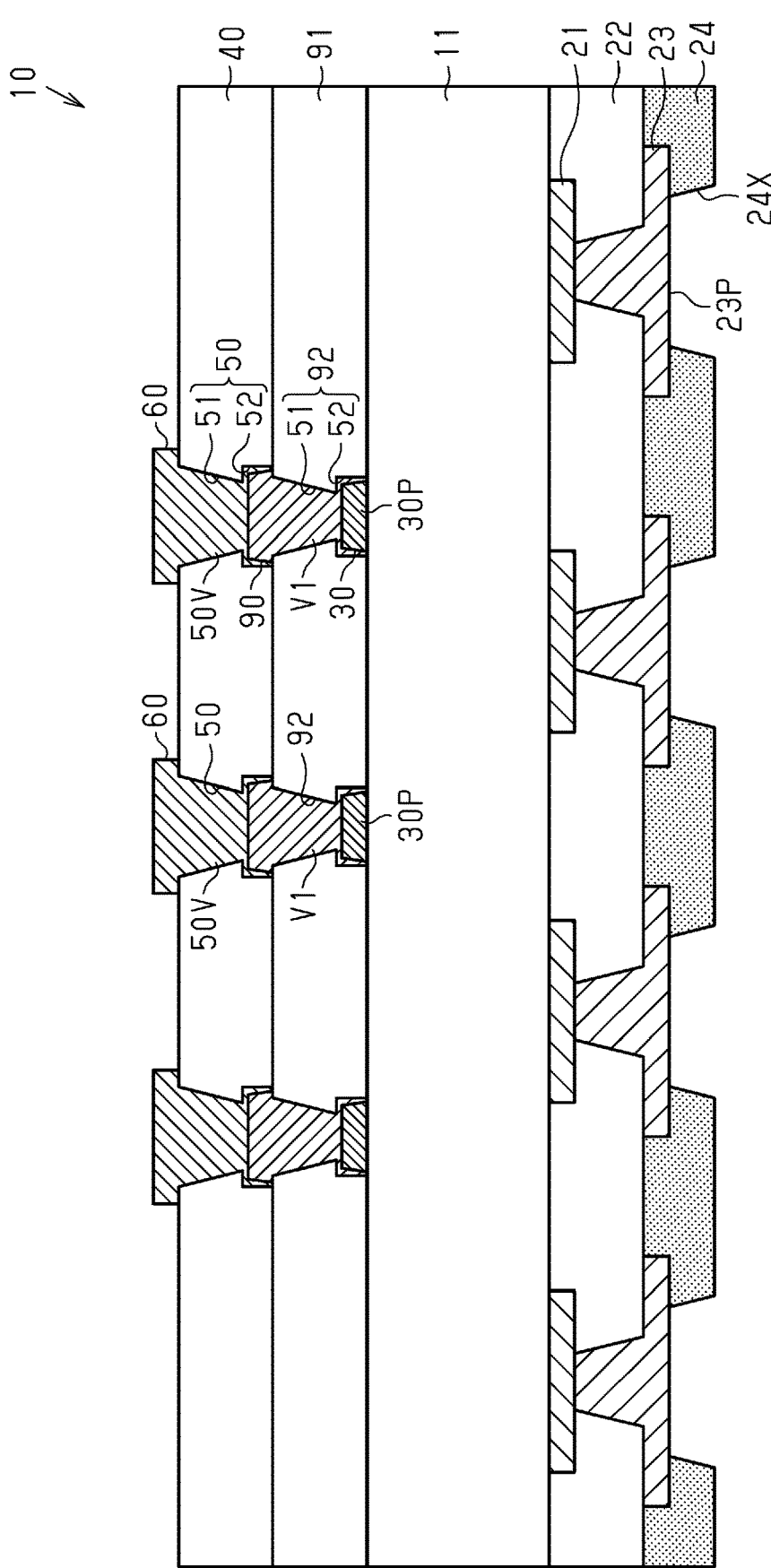
FIG. 15 is a schematic cross-sectional view illustrating a wiring substrate in another modified example.

In an example, as illustrated in FIG. 15, a wiring layer 90 is arranged at an inner side of the outermost wiring layer 60, the wiring layer 30 is arranged at an inner side of the wiring layer 90, and the wiring layer 30 and the wiring layer 90 are connected by a via wiring V1. The via wiring V1 may have the same structure as the via wiring 50V. The via wiring V1 extends through an insulation layer 91 covering the upper surface of the wiring layer 30. The via wiring V1 is formed continuously and integrally with the wiring layer 90. The via wiring V1 fills a through hole 92 extending through the insulation layer 91 in the thickness-wise direction. The through hole 92 includes the first hole 51 and the second hole 52 in the same manner as the through hole 50.

In the manufacturing method of the wiring substrate 10 of the embodiment, after the first hole 51 is formed, the desmear process is performed twice to form the second hole 52 that is continuous with the first hole 51. However, there is no limitation to such a configuration. In an example, after the first hole 51 is formed, the desmear process may be performed once to form the second hole 52 that is continuous with the first hole 51. The process for forming the second hole 52 is not limited to a desmear process.

In the manufacturing method of the wiring substrate 10 of the embodiment, the first hole 51 is formed by laser drilling. Alternatively, for example, the first hole 51 may be formed by a process other than laser drilling.

In the embodiment, the seed layer 70 has a single-layer structure. Alternatively, the seed layer 70 may be embodied in a seed layer having a multilayer structure (e.g., two-layer structure). An example of the seed layer 70 having a two-layer structure has a structure in which a titanium (Ti) layer and a Cu layer are sequentially formed.

In the embodiment, the structure of the wiring substrate 10 may be changed. In an example, as long as the wiring substrate 10 includes the wiring layer 30, the insulation layer 40, the through hole 50, the via wiring 50V, and the wiring layer 60, the remaining structure is not particularly limited. For example, the wiring substrate 10 may have a structure including a core substrate or may be a coreless substrate, which does not include a core substrate.

In the embodiment, the wiring substrate 10 may be embodied in a wiring substrate that is used for a package such as a chip size package (CSP) or a small out line non-lead package (SON).

Clauses

This disclosure includes the following embodiments.

1. A method for manufacturing a wiring substrate, the method including:

forming a first wiring layer on an upper surface of a first insulation layer, the first wiring layer including a pad;

forming a second insulation layer on the upper surface of the first insulation layer to cover the first wiring layer;

forming a first hole in the second insulation layer to expose a portion of an upper surface of the pad;

forming a second hole in the second insulation layer so that the second hole is continuous with the first hole and increases a width of a bottom opening of the first hole and exposes a side surface of the pad entirely in a thickness-wise direction of the pad;

forming a via wiring filling the first hole and the second hole; and forming a second wiring layer on an upper surface of the second insulation layer integrally with the via wiring.

2. The method according to clause 1, in which the forming a first hole includes forming the first hole by laser drilling, and the forming a second hole includes increasing a width of a bottom opening of the first hole by a first desmear process, and further increasing the width of the bottom opening of the first hole by a second desmear process that differs from the first desmear process to form the second hole.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A wiring substrate, comprising:

a first insulation layer;

a first wiring layer including a pad formed on an upper surface of the first insulation layer;

a second insulation layer formed on the upper surface of the first insulation layer to cover the first wiring layer;

a first hole extending through the second insulation layer in a thickness-wise direction of the second insulation layer and exposing a portion of an upper surface of the pad, the first hole including a first wall extending downward from an upper surface of the second insulation layer;

a second hole formed in the second insulation layer to be continuous with the first hole, the second hole increasing a width of a bottom opening of the first hole thereby exposing a portion of the upper surface of the first insulation layer and entirely exposing a side surface of the pad in a thickness-wise direction of the pad, the second hole including:

a second wall extending from a lower end of the first wall to an outer side of the first hole;

a third wall extending from an outer end of the second wall to the upper surface of the first insulation layer; and a first gap defined between the side surface of the pad and the third wall, the first gap narrowing between the side surface of the pad and the third wall from the upper surface of the pad toward a lower surface of the pad;

a via wiring filling the first hole and the second hole; and a second wiring layer formed on the upper surface of the second insulation layer integrally with the via wiring.

2. The wiring substrate according to claim 1, wherein the third wall extends perpendicular to the upper surface of the first insulation layer, and the side surface of the pad is inclined toward the third wall from the upper surface of the pad toward the lower surface of the pad.

3. The wiring substrate according to claim 1, wherein the via wiring includes a tapered via conductor filling the first hole, and a tubular via conductor filling the second hole and formed integrally with the tapered via conductor, and the tubular via conductor entirely covers the upper surface of the pad and the side surface of the pad.

4. The wiring substrate according to claim 1, wherein the second wall extends in a planar direction that is orthogonal to the thickness-wise direction of the second insulation layer.

5. The wiring substrate according to claim 1, wherein the second wall is inclined downward from the lower end of the first wall to an upper end of the third wall.

6. The wiring substrate according to claim 1, wherein the first wall is inclined toward a center of the first hole in plan view from the upper surface of the second insulation layer toward the upper surface of the pad.

7. The wiring substrate according to claim 1, wherein the second hole is formed around the pad along an entire perimeter of the pad, and the via wiring entirely covers the side surface of the pad.

8. The wiring substrate according to claim 1, wherein the via wiring includes a seed layer covering the first wall, the second wall, the third wall, the upper surface of the first insulation layer exposed from the second hole, the side surface of the pad, and the upper surface of the pad, and a metal layer formed on the seed layer and filling the first hole and the second hole.

\* \* \* \* \*